(12) United States Patent
Monroe et al.

(10) Patent No.: US 10,141,870 B2
(45) Date of Patent: Nov. 27, 2018

(54) AUTOMATED VERIFICATION TESTING FOR A MOTOR CAPACITOR

(71) Applicant: MJG Innovations, LLC, Fort Worth, TX (US)

(72) Inventors: Brandon Monroe, McKinney, TX (US); Denny English, Malvern, AR (US); Mike Pearson, Pittsburg, TX (US)

(73) Assignee: MJG INNOVATIONS, LLC, Fort Worth, TX (US)

( * ) Notice: Subject to any disclaimer, the term of this patent is extended or adjusted under 35 U.S.C. 154(b) by 538 days.

(21) Appl. No.: 14/449,941

(22) Filed: Aug. 1, 2014

(65) Prior Publication Data

US 2015/0270793 A1    Sep. 24, 2015

Related U.S. Application Data

(60) Provisional application No. 61/968,979, filed on Mar. 21, 2014, provisional application No. 62/017,684, filed on Jun. 26, 2014.

(51) Int. Cl.
*H02P 1/44* (2006.01)
*H02P 1/02* (2006.01)
(Continued)

(52) U.S. Cl.
CPC ............ *H02P 1/022* (2013.01); *G01R 31/028* (2013.01); *H02P 1/44* (2013.01); *H02P 25/04* (2013.01);
(Continued)

(58) Field of Classification Search
CPC ............ F04B 49/065; F04B 2203/0202; F04B 2203/0209; F04B 35/045; F04B 49/12; B60H 1/3223; B62D 5/0487; B62D 5/049; F24F 2011/0083; F25B 49/022; G06F 1/20; H02K 17/08; H02M 5/4585; H02M 7/483
(Continued)

(56) References Cited

U.S. PATENT DOCUMENTS 4,451,775 A * 5/1984 Phillips ..................... H02P 9/46
318/376
4,709,225 A * 11/1987 Welland ................. G01R 17/02
341/121

(Continued)

*Primary Examiner* — Bentsu Ro
(74) *Attorney, Agent, or Firm* — Carstens & Cahoon, LLP; Jeffrey G. Degenfelder

(57) ABSTRACT

A motor capacitor verification unit includes a capacitor selection section coupled to an electric motor employing a motor capacitor for its operation that connects the motor capacitor for verification testing. Also included is a capacitor testing section coupled to the capacitor selection section that evaluates the motor capacitor for operation with the electric motor. Further included is an AC power control section coupled to the capacitor testing section and that only permits application of an AC operating voltage to the electric motor and the motor capacitor after a successful motor capacitor verification as required for electric motor operation. An electric motor operating system, an HVAC operating system and methods of operating an electric motor, retrofitting a motor capacitor verification unit to an electric motor and manufacturing a motor capacitor verification unit for use with an electric motor are also provided.

49 Claims, 8 Drawing Sheets

(51) Int. Cl.
*H02P 25/04* (2006.01)
*G01R 31/02* (2006.01)
*G01R 31/34* (2006.01)

(52) U.S. Cl.
CPC ......... *G01R 31/34* (2013.01); *Y10T 29/49009* (2015.01)

(58) Field of Classification Search
USPC .................................................. 318/794, 795
See application file for complete search history.

(56) References Cited

U.S. PATENT DOCUMENTS

| | | | | | |
|---|---|---|---|---|---|
| 5,670,881 | A | * | 9/1997 | Arakawa | G01R 33/3628 324/322 |
| 6,459,596 | B1 | * | 10/2002 | Corzine | H02M 5/4585 363/127 |
| 6,616,416 | B1 | * | 9/2003 | Tolbert, Jr. | B60H 1/3223 318/794 |
| 7,015,673 | B1 | * | 3/2006 | Kernkamp | H02P 25/24 318/798 |
| 8,933,712 | B2 | * | 1/2015 | Wu | G01R 27/2605 324/679 |
| 2002/0143450 | A1 | * | 10/2002 | Fujimoto | B62D 5/049 701/43 |
| 2003/0156946 | A1 | * | 8/2003 | Tolbert, Jr. | B60H 1/3223 417/45 |
| 2008/0199159 | A1 | * | 8/2008 | Lee | G06F 1/20 388/815 |
| 2008/0292292 | A1 | * | 11/2008 | Ni | H02P 6/15 388/812 |
| 2009/0148307 | A1 | * | 6/2009 | Jeong | F04B 49/065 417/44.1 |
| 2009/0160393 | A1 | * | 6/2009 | Choi | H02P 1/445 318/794 |
| 2009/0223051 | A1 | * | 9/2009 | Johnson | F24F 13/00 29/888.021 |
| 2011/0001450 | A1 | * | 1/2011 | Hancock | H02P 1/44 318/785 |
| 2011/0311371 | A1 | * | 12/2011 | Johnson | F24F 13/00 417/1 |
| 2013/0193990 | A1 | * | 8/2013 | Wu | G01R 27/2605 324/679 |
| 2013/0204554 | A1 | * | 8/2013 | Tuckey | G01R 19/2513 702/58 |
| 2013/0342225 | A1 | * | 12/2013 | Gehrig | G01N 33/365 324/684 |

* cited by examiner

AUTOMATED VERIFICATION TESTING FOR A MOTOR CAPACITOR

CROSS-REFERENCE TO RELATED APPLICATIONS

This application claims the benefit of U.S. Provisional Application Ser. No. 61/968,979, filed by Brandon Monroe on Mar. 21, 2014, entitled "AC Motor Saver," commonly assigned with this application and incorporated herein by reference.

This application also claims the benefit of U.S. Provisional Application Ser. No. 62/017,684, filed by Brandon Monroe on Jun. 26, 2014, entitled "AC Motor Saver 2," commonly assigned with this application and incorporated herein by reference.

TECHNICAL FIELD

This application is directed, in general, to electric motor operation and, more specifically, to a motor capacitor verification unit, an electric motor operating system, an HVAC operating system, a method of operating an electric motor, a method of retrofitting a motor capacitor verification unit to an electric motor and a method of manufacturing a motor capacitor verification unit for use with an electric motor.

BACKGROUND

Single phase induction motors are employed extensively in a variety of applications since they are readily available in a wide range of sizes and mechanical output power capabilities. Although they advantageously do not require mechanical commutation, they are dependent on at least one capacitor for proper operation. One required capacitor is usually designated as a "run capacitor" and is required to provide a phase shift in a stator winding electromagnetic field that causes the rotor to rotate. Some motors that are required to provide heavy mechanical torque while starting, have an addition stator winding designed to use a "start capacitor" for this purpose. Capacitance values required for each of these capacitors are typically dependent on specific motor requirements. When these capacitors vary from a required capacitance range or become shorted or open, the associated motor is usually damaged or fails, requiring its replacement. What is needed in the art is an improved technique to verify capacitor integrity and prevent motor damage or failure.

SUMMARY

Embodiments of the present disclosure provide a motor capacitor verification unit, an electric motor operating system, an HVAC operating system, a method of operating an electric motor, a method of retrofitting a motor capacitor verification unit to an electric motor and a method of manufacturing a motor capacitor verification unit for use with an electric motor.

In one embodiment, the motor capacitor verification unit includes a capacitor selection section coupled to an electric motor employing a motor capacitor for its operation and configured to connect the motor capacitor for verification testing. The motor capacitor verification unit also includes a capacitor testing section coupled to the capacitor selection section and configured to evaluate the motor capacitor for operation with the electric motor. The motor capacitor verification unit further includes an AC power control section coupled to the capacitor testing section and configured to only permit application of an AC operating voltage to the electric motor and the motor capacitor after a successful motor capacitor verification as required for electric motor operation.

In another embodiment, the electric motor operating system includes one or more electric motors, each employing one or more motor capacitors required for electric motor operation and a motor capacitor verification unit. The motor capacitor verification unit has a capacitor selection section, coupled to each of the one or more electric motors and the one or more motor capacitors, that connects each of the one or more motor capacitors for verification testing. The motor capacitor verification unit also has a capacitor testing section, coupled to the capacitor verification section, that evaluates the one or more motor capacitors required for electric motor operation. The motor capacitor verification unit further has an AC power control section, coupled to the capacitor testing section, that only permits application of an AC operating voltage to the one or more electric motors and the one or more motor capacitors following a successful motor capacitor verification of the one or more motor capacitors required for electric motor operation.

In yet another embodiment, the HVAC operating system includes a compressor unit having compressor and fan motors that respectively employ a compressor motor capacitor and a fan motor capacitor for their operation, and a blower motor unit having a blower motor that employs a blower motor capacitor for its operation. The HVAC operating system also includes a motor capacitor verification unit having a capacitor selection section, a capacitor testing section and an AC power control section. The capacitor selection section connects the compressor, fan and blower motor capacitors for verification testing; the capacitor testing section is coupled to the capacitor selection section and evaluates the compressor, fan and blower motor capacitors for operation with their respective compressor, fan and blower motors; and the AC power control section is coupled to the capacitor testing section, and only permits application of an AC operating voltage to the compressor, fan and blower motors and their respective compressor, fan and blower motor capacitors following successful compressor, fan and blower motor capacitor verifications required for compressor, fan and blower motor operations.

In a further embodiment, the method of operating an electric motor includes providing an electric motor employing a motor capacitor required for operation of the electric motor, connecting the motor capacitor for verification testing, evaluating the motor capacitor for operation with the electric motor and permitting application of an AC operating voltage to the electric motor and the motor capacitor only after a successful motor capacitor verification as required for electric motor operation.

In yet a further embodiment, the method of retrofitting a motor capacitor verification unit to an electric motor includes providing an electric motor having a motor capacitor lead connected to the electric motor and having an AC operating voltage controller with a voltage control input connected to a motor activation control signal that activates the AC operating voltage controller for operation of the electric motor. The method of retrofitting a motor capacitor verification unit to an electric motor also includes disconnecting the motor capacitor lead from the electric motor and the motor activation control signal from the voltage control input of the AC operating voltage source.

The method of retrofitting a motor capacitor verification unit to an electric motor further also includes connecting the motor capacitor lead to a motor capacitor input provided by a motor capacitor verification unit, connecting the electric motor to a motor capacitor output provided by the motor capacitor verification unit, connecting the motor activation control signal to an activation input of the motor capacitor verification unit and connecting an AC voltage control output of the motor capacitor verification unit to the voltage control input of the AC operating voltage controller.

In still a further embodiment, the method of manufacturing a motor capacitor verification unit for use with an electric motor includes providing a wiring structure that is electrically interconnected and functionally configured to fabricate a motor capacitor verification unit for verification testing of a motor capacitor required for operation of an electric motor, providing wiring structure components that are required to fabricate the motor capacitor verification unit and fabricating the motor capacitor verification unit that includes a capacitor selection section, a capacitor testing section and an AC power control section with the wiring structure components.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which.

DETAILED DESCRIPTION

Embodiments of the present disclosure provide automated testing of motor capacitors that are associated with electric motors requiring them for their operation. These embodiments may be generally employed, but are particularly adaptable for use with electric motors used in pumping or HVAC (heating, ventilation and air conditioning) applications. They may be especially useful for remote applications where replacing an installed motor capacitor is particularly difficult.

For purposes of the present disclosure, the term "successful motor capacitor validation" is defined to mean that pertinent operating capacitor characteristics of a motor capacitor have been verified to be within a required operating range for proper operation with its associated electric motor. Typically, an important capacitor operating characteristic for validation of the motor capacitor is that its capacitance be within a specified capacitance range for its required operating application.

Additionally, the term "failed motor capacitor validation" is defined to mean that at least one pertinent operating characteristic of a motor capacitor has failed verification testing indicating that the operating characteristic lies outside of a required operating range and that the motor capacitor cannot be employed with its intended electric motor. This term also includes a motor capacitor being electrically shorted or open.

Figure 1:
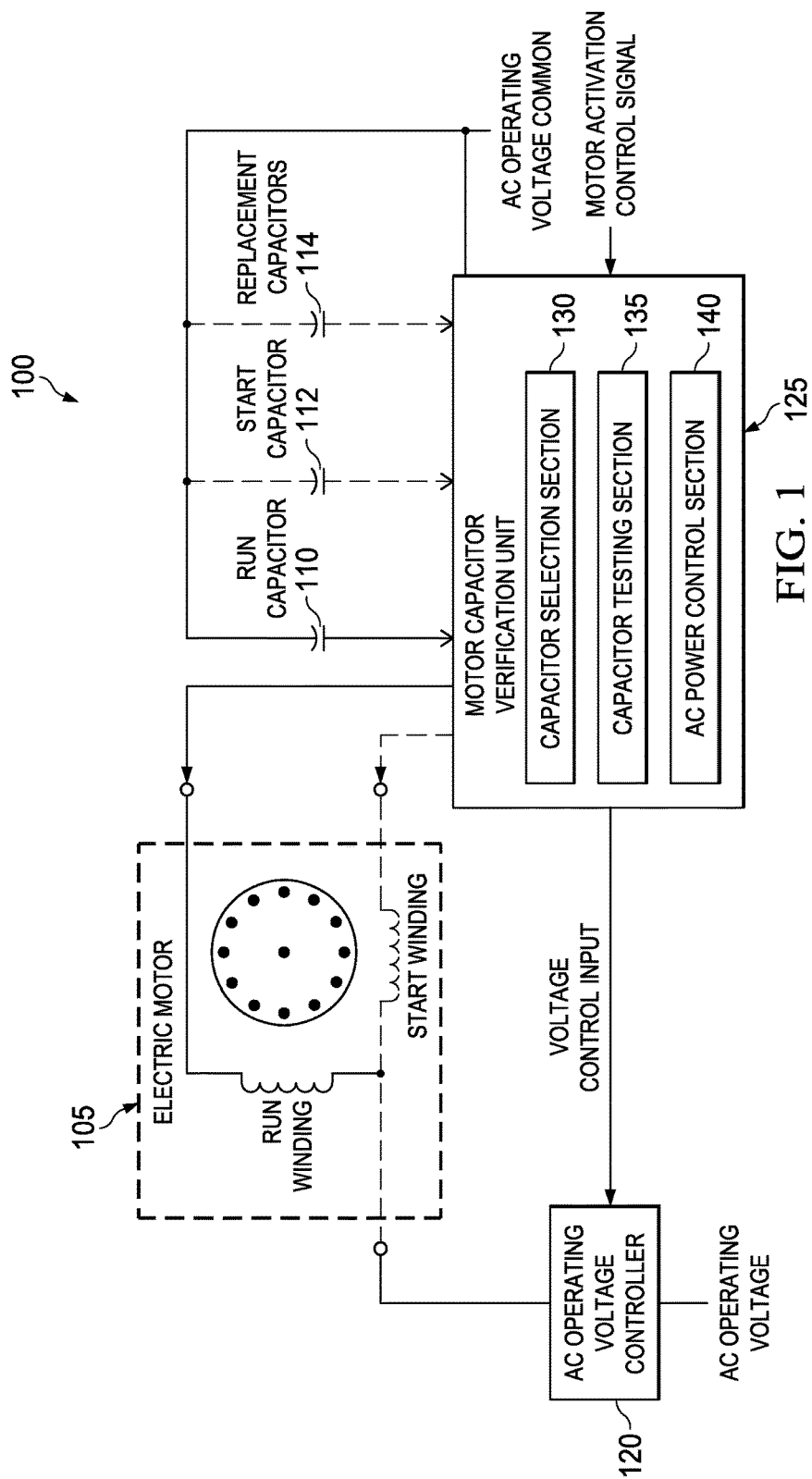
FIG. 1 illustrates a diagram of an embodiment of an electric motor operating system constructed according to the principles of the present disclosure.

FIG. 1 illustrates a diagram of an embodiment of an electric motor operating system, generally designated 100, constructed according to the principles of the present disclosure. The electric motor operating system 100 is representative of an electric motor operating system that may be employed with any electric motor requiring a motor capacitor. Common examples include a pump (e.g., a swimming pool pump) or an HVAC unit (e.g., a blower unit), for example.

The electric motor operating system 100 includes an electric motor 105, a motor run capacitor 110, an AC operating voltage controller 120 and a motor capacitor verification unit 125. Also shown are an optional motor start capacitor 112 that may be required for some electric motors as well as optional replacement motor run and start capacitors 114 that may be employed in the event of a failed motor capacitor verification condition. The motor capacitor verification unit 125 includes a capacitor selection section 130, a capacitor testing section 135 and an AC power control section 140. The motor capacitor verification unit 125 employs a motor activation control signal to initiate motor capacitor verification testing and provides an AC voltage control signal to activate the AC operating voltage controller 120.

The capacitor selection section 130 couples the electric motor 105 to the motor run capacitor 110 for motor operation and is configured to connect the motor run capacitor 110 for verification testing. The capacitor selection section 130 may be expanded to accommodate the optional motor start capacitor 112 and optional replacement motor run and start capacitors 114, if employed. The capacitor testing section 135 is coupled to the capacitor selection section 130 and is configured to evaluate the motor run capacitor 110 for operation with the electric motor 105. The AC power control section 140 is coupled to the capacitor testing section 130 and is configured to only permit application of an AC operating voltage (employing the AC operating voltage controller 120) to the electric motor 105 and the motor run capacitor 110 after a successful motor capacitor verification of the motor run capacitor 110.

Figure 2:
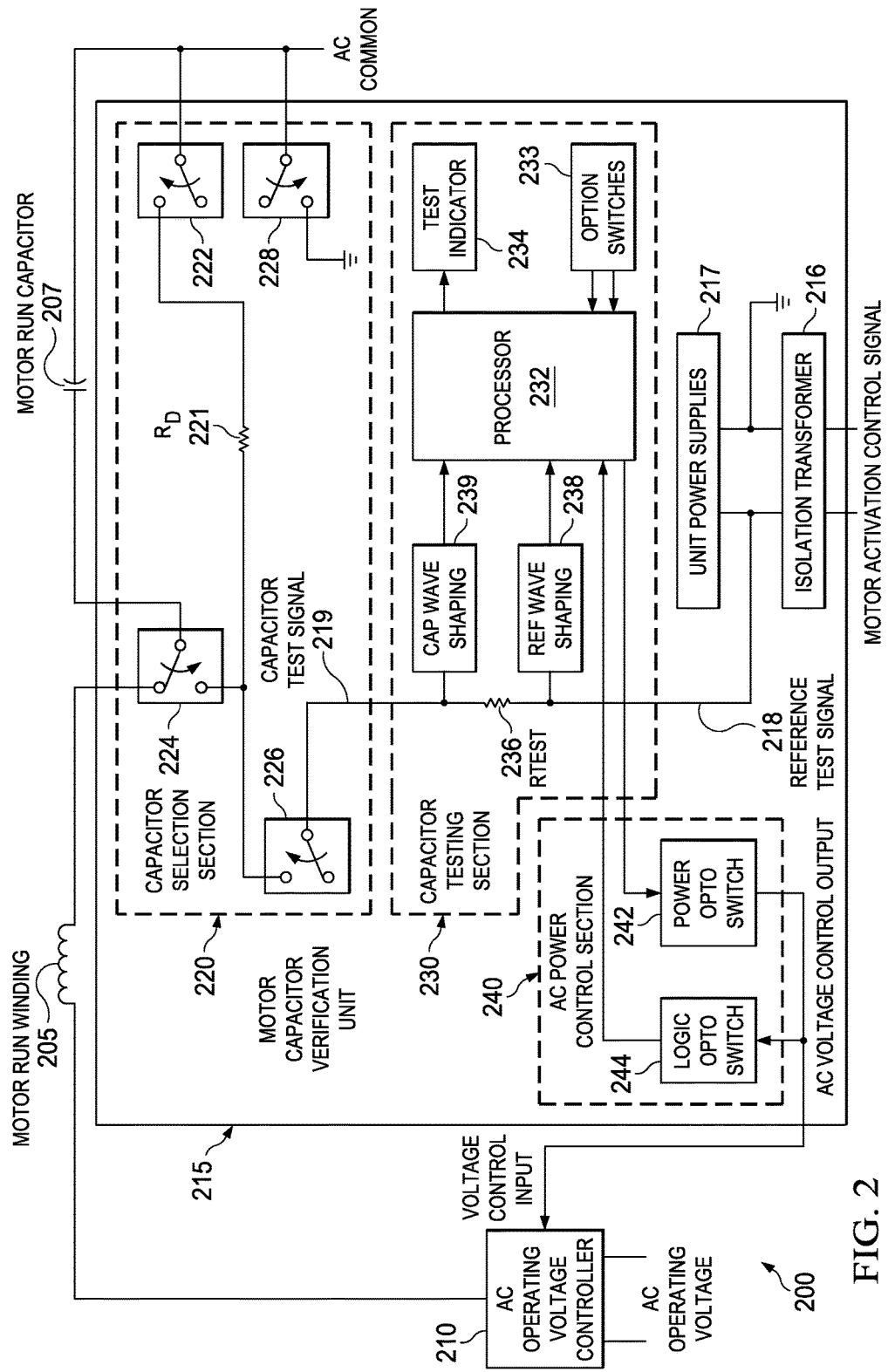
FIG. 2 illustrates a more detailed diagram of an embodiment of an electric motor operating system constructed according to the principles of the present disclosure.

FIG. 2 illustrates a more detailed diagram of an embodiment of an electric motor operating system, generally designated 200, constructed according to the principles of the present disclosure. Although not explicitly shown in the electric motor operating system 200, an optional motor start capacitor as well as optional replacement motor run and start capacitors may also be included that require verification testing.

The electric motor operating system 200 includes a motor run winding 205 and a motor run capacitor 207 that are associated with an electric motor and connected to an AC operating voltage controller 210 and a motor capacitor verification unit 215. The motor capacitor verification unit 215 includes an isolation transformer 216, unit power supplies 217, a capacitor selection section 220, a capacitor testing section 230 and an AC power control section 240. The capacitor selection section 220 includes a capacitor discharge resistor ($R_D$) 221 and first, second, third and fourth switches (e.g., relays) 222, 224, 226, 228 that are employed to connect and route the motor run capacitor 207 for verification testing. The capacitor testing section 230 includes a processor 232, option switches 233, a test indicator 234, a test resistor ($R_{TEST}$) 236, a reference wave shaping circuit 238 and a capacitor wave shaping circuit 239. The AC power control section 240 includes a power optical switch 242 and a logic optical switch 244.

In the illustrated embodiment, the motor capacitor verification unit 215 is powered up when a motor activation control signal, which may be a voltage control signal calling for operation of the electric motor, is applied to the isolation transformer 216. The output of the isolation transformer 216 is applied to the unit power supplies 217, which in turn provides required voltages and currents for the motor capacitor verification unit 215 to operate. The output of the isolation transformer 216 also serves as a reference test signal 218 for the capacitor testing section 230.

At power-up, the processor 232 initializes and prepares the motor capacitor verification unit 215 for validation testing of the motor capacitor 207. Operation of the first, second, third and fourth switches (e.g., relays) 222, 224, 226, 228 of the capacitor selection section 220 is controlled by the processor 232 (this control is not explicitly shown in FIG. 2), and the switches 222, 224, 226, 228 are shown in their pretest positions (i.e., motor run positions).

Before verification testing, the first and second switches 222, 224 are activated thereby disconnecting the motor run capacitor 207 from the motor run winding 205 and placing the motor run capacitor 207 across the capacitor discharge resistor (RD) 221. At least seven time constants of the discharge resistor 221 and the motor run capacitor 207 are allowed for any remnant charge on the motor run capacitor to discharge sufficiently before proceeding with verification testing. At the conclusion of discharge, the first switch 222 is deactivated, the second switch 224 remains activated and the third and fourth switches 226, 228 are activated thereby placing the motor rum capacitor 207 in a verification testing position.

The reference test signal 218 (an AC signal) is applied to a series connection of the test resistor 236 and the motor run capacitor 207. The reference test signal 218 and a capacitor test signal 219 (i.e., the resulting AC signal across the motor run capacitor 207 during testing) are respectively applied to inputs of the reference wave shaping circuit 238 and the capacitor wave shaping circuit 239. The reference and capacitor wave shaping circuits 238, 239 provide signal gain to improve delineation of a baseline crossing for each of the reference and capacitor test signals 218, 219. In one embodiment, this signal gain is a fixed gain, and in another embodiment, this gain is selectable by the processor 232.

A time period corresponding to the difference in base line crossing times of the reference test signal 218 and the capacitor test signal 219 is captured for multiple time periods. This action provides an average for the time period and may also provide other statistical information for the motor run capacitor 207. This time period is proportional to the capacitance value of the motor run capacitor 207. Additionally, amplitude information of the capacitor test signal 219 when compared to the reference test signal 218 may be employed to indicate an electrical short or open condition of the motor run capacitor 207.

The processor 232 employs information provided by the option switches 233 in analyzing this validation test information. The option switches allow selection of pertinent capacitance values and capacitance tolerance percentage values that provide comparison information for the motor run capacitor 207. A successful motor capacitor verification validates that the motor run capacitor 207 has a capacitance value that falls within an acceptable capacitance range. A failed capacitor motor capacitor verification indicates that the motor run capacitor 207 has a capacitance value that falls outside of an acceptable range including a shorted or open condition. The successful or failed motor capacitor verification result is indicated by the test indicator 234.

For a successful motor capacitor verification result, the processor 232 deactivates the second switch 224 returning it to the motor run position and then activates the power OPTO switch 242, which supplies an AC voltage control signal to the AC operating voltage controller 210. This provides the AC operating voltage to the motor run winding 205 and the motor run capacitor 207 for operation of the electric motor. The logic OPTO switch indicates to the processor 232 that power to the electric motor has been applied.

Figure 3:
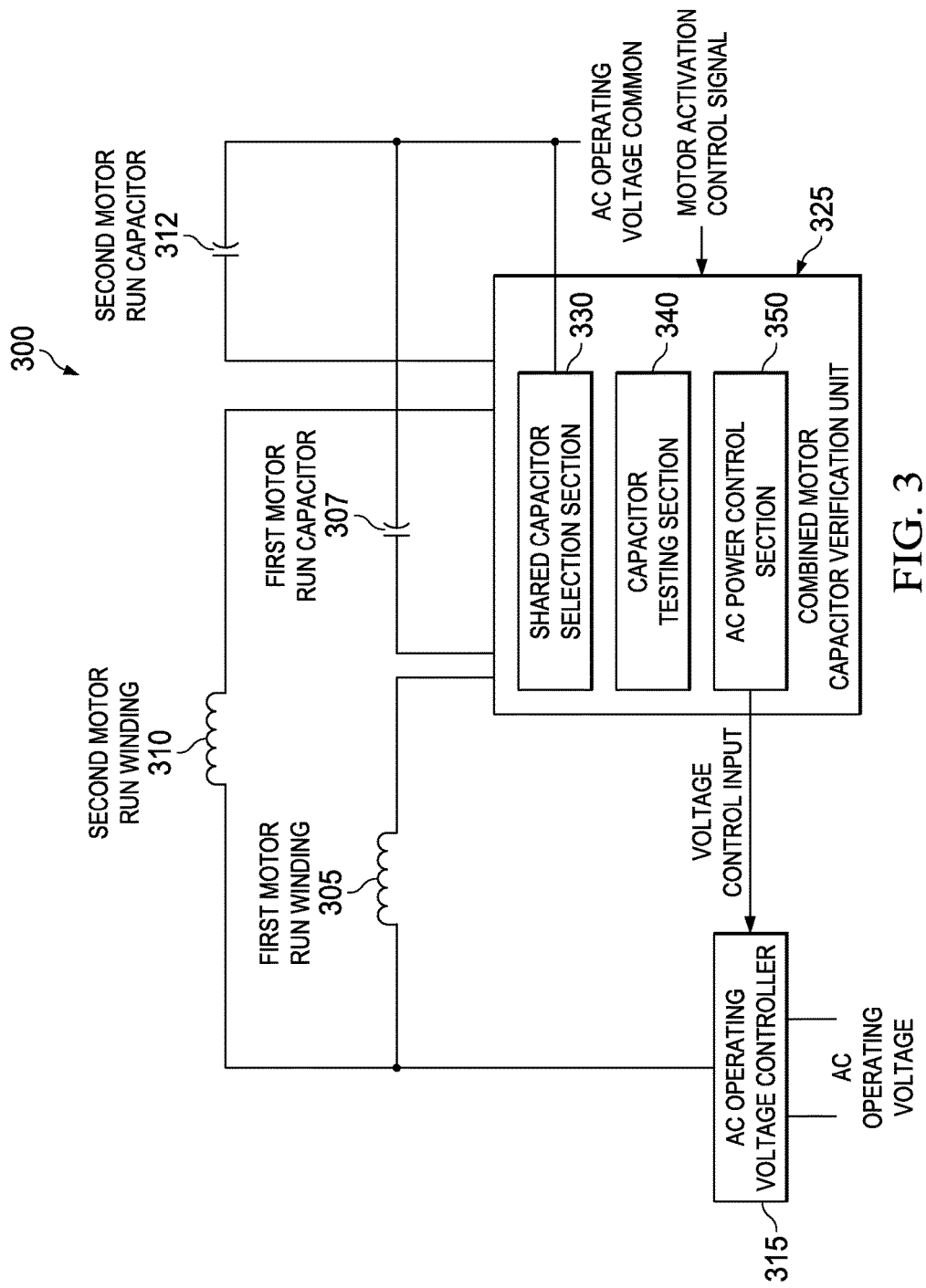
FIG. 3 illustrates a diagram of an embodiment of an electric motor operating system employing more than one motor constructed according to the principles of the present disclosure.

FIG. 3 illustrates a diagram of an embodiment of an electric motor operating system employing more than one motor, generally designated 300, constructed according to the principles of the present disclosure. The electric motor operating system 300 is representative of an electric motor operating system that may be employed with an application requiring first and second pumps (e.g., a swimming pool) or an HVAC unit (e.g., a compressor and a fan), for example. Generally, as before and although not explicitly shown in the electric motor operating system 300, an optional motor start capacitor as well as optional replacement motor run and start capacitors may also be included that require verification testing.

The electric motor operating system 300 includes a first motor run winding 305 and a first motor run capacitor 307 associated with a first electric motor, a second motor run winding 310 and a second motor run capacitor 312 associated with a second electric motor that are connected to an AC operating voltage controller 315 and a combined motor capacitor verification unit 325. The combined motor capacitor verification unit 325 includes a shared capacitor selection section 330, a capacitor testing section 340 and an AC power control section 350. The combined motor capacitor verification unit 325 employs a motor activation control signal to initiate motor capacitor verification testing and provides an AC voltage control signal to activate the AC operating voltage controller 315.

General operation of the combined motor capacitor verification unit 325 parallels that of the motor capacitor verification unit 125. However, the shared capacitor selection section 330 is expanded to accommodate connection and routing of the second motor run winding 310 and the second motor run capacitor 312, as shown. Operation of the capacitor testing section 340 and the AC power control section 350 parallel those of the capacitor testing section 135 and the AC power control section 140.

Figure 4:
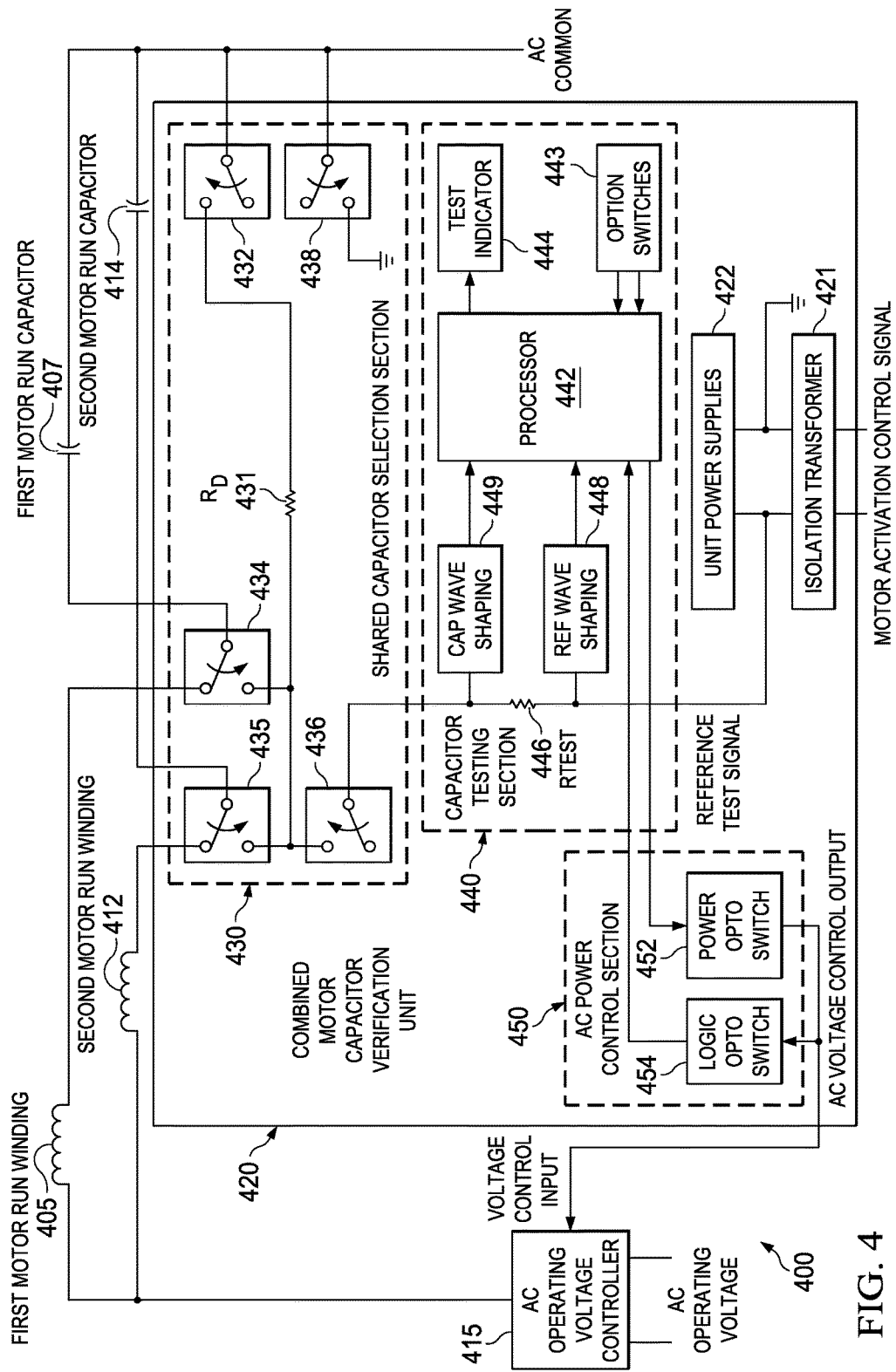
FIG. 4 illustrates a more detailed diagram of an embodiment of an electric motor operating system that employs more than one motor and is constructed according to the principles of the present disclosure.

FIG. 4 illustrates a more detailed diagram of an embodiment of an electric motor operating system, generally designated 400, that employs more than one motor and is constructed according to the principles of the present disclosure. Again, the electric motor operating system 400 may include an optional motor start capacitor as well as optional replacement motor run and start capacitors requiring verification testing.

The electric motor operating system 400 includes a first motor run winding 405 and a first motor run capacitor 407 associated with a first electric motor and a second motor run winding 412 and a second motor run capacitor 414 associated with a second electric motor that are connected to an AC operating voltage controller 415 as well as a motor capacitor verification unit 420. The motor capacitor verification unit 420 includes an isolation transformer 421, unit power supplies 422, a shared capacitor selection section 430, a capacitor testing section 440 and an AC power control section 450.

The shared capacitor selection section 430 includes a capacitor discharge resistor (RD) 431 and first, second, third, fourth and fifth switches (e.g., relays) 432, 434, 435, 436, 438 that are employed to connect and route the first and second motor run capacitors 407, 414 for verification testing. The capacitor testing section 440 includes a processor 442, option switches 443, a test indicator 444, a test resistor ($R_{TEST}$) 446, a reference wave shaping circuit 448 and a capacitor wave shaping circuit 449. The AC power control section 450 includes a power optical switch 452 and a logic optical switch 454.

General operation of the combined motor capacitor verification unit 420 parallels that of the motor capacitor verification unit 215. However, the shared capacitor selection section 430 is expanded to accommodate connection of the second motor run winding 412 and the second motor run capacitor 414, as shown. The first motor run capacitor 407 is discharged and routed for testing first. After testing of the first motor run capacitor 407 is complete, the second motor run capacitor 414 is discharged and routed for testing. Verification test results for both the first and second motor run capacitors are provided by the test indicator 444. A successful motor capacitor verification is required for both the first motor run capacitor 407 and the second motor run capacitor 414 to activate the AC operating voltage controller 415 and connect the AC operating voltage to the first and second electric motors and their run capacitors.

Figure 5:
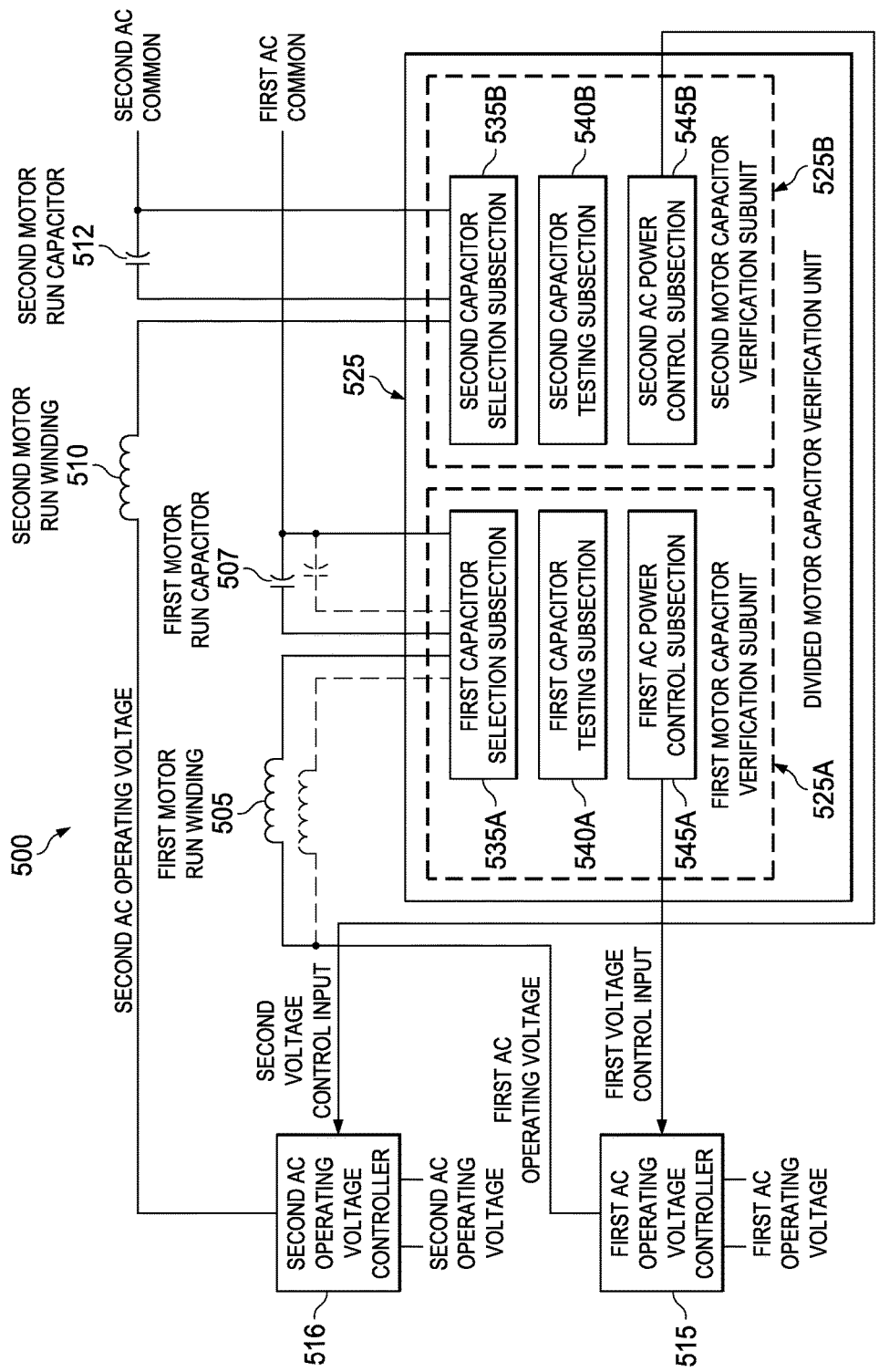
FIG. 5 illustrates a diagram of an embodiment of an electric motor operating system employing more than one motor and more than one AC operating voltage controller constructed according to the principles of the present disclosure.

FIG. 5 illustrates a diagram of an embodiment of an electric motor operating system employing more than one motor and more than one AC operating voltage controller, generally designated 500, constructed according to the principles of the present disclosure. Again, although not explicitly shown in the electric motor operating system 500, one or more optional motor start capacitors as well as optional replacement motor run and start capacitors may also be included that require verification testing.

The electric motor operating system 500 is representative of an electric motor operating system that may be employed with an application requiring first and second motors having separate AC operating voltage controllers. If another electric motor is added to one of the AC operating voltage controllers (as indicated in FIG. 5), the electric motor operating system 500 so modified may be representative of an HVAC system where the two parallel electric motors are compressor and fan motors and the single motor is a blower motor.

The electric motor operating system 500 includes a first motor run winding 505 of a first electric motor and a first motor run capacitor 507, a second motor run winding 510 of a second electric motor and a second motor run capacitor 512 that are respectively connected to a first AC operating voltage controller 515 and a second AC operating voltage controller 516. The electric motor operating system 500 also includes a divided motor capacitor verification unit 525.

The divided motor capacitor verification unit 525 includes first and second motor capacitor verification subunits 525A, 525B, as shown. The first motor capacitor verification subunit 525A includes a first capacitor selection subsection 535A, a first capacitor testing subsection 540A and a first AC power control subsection 545A that controls the first AC operating voltage controller 515. If another electric motor is added to the first AC operating voltage controller 515, as indicated in FIG. 5, the first capacitor selection subsection 535A becomes a first shared capacitor selection subsection 535A. Similarly, the second motor capacitor verification subunit 525B includes a second capacitor selection subsection 535B, a second capacitor testing subsection 540B and a second AC power control subsection 545B that controls the second AC operating voltage controller 516.

In this embodiment, the first and second motor capacitor verification subunits 525A, 525B typically operate separately of one another, and may employ separate motor activation control signals. Alternately, they may employ a common motor activation control signal. Each of the first and second motor capacitor verification subunits 525A, 525B generally operate as the motor capacitor verification unit 125 of FIG. 1, or as the combined motor capacitor verification unit 325 of FIG. 3 if an additional motor is included.

Figure 6:
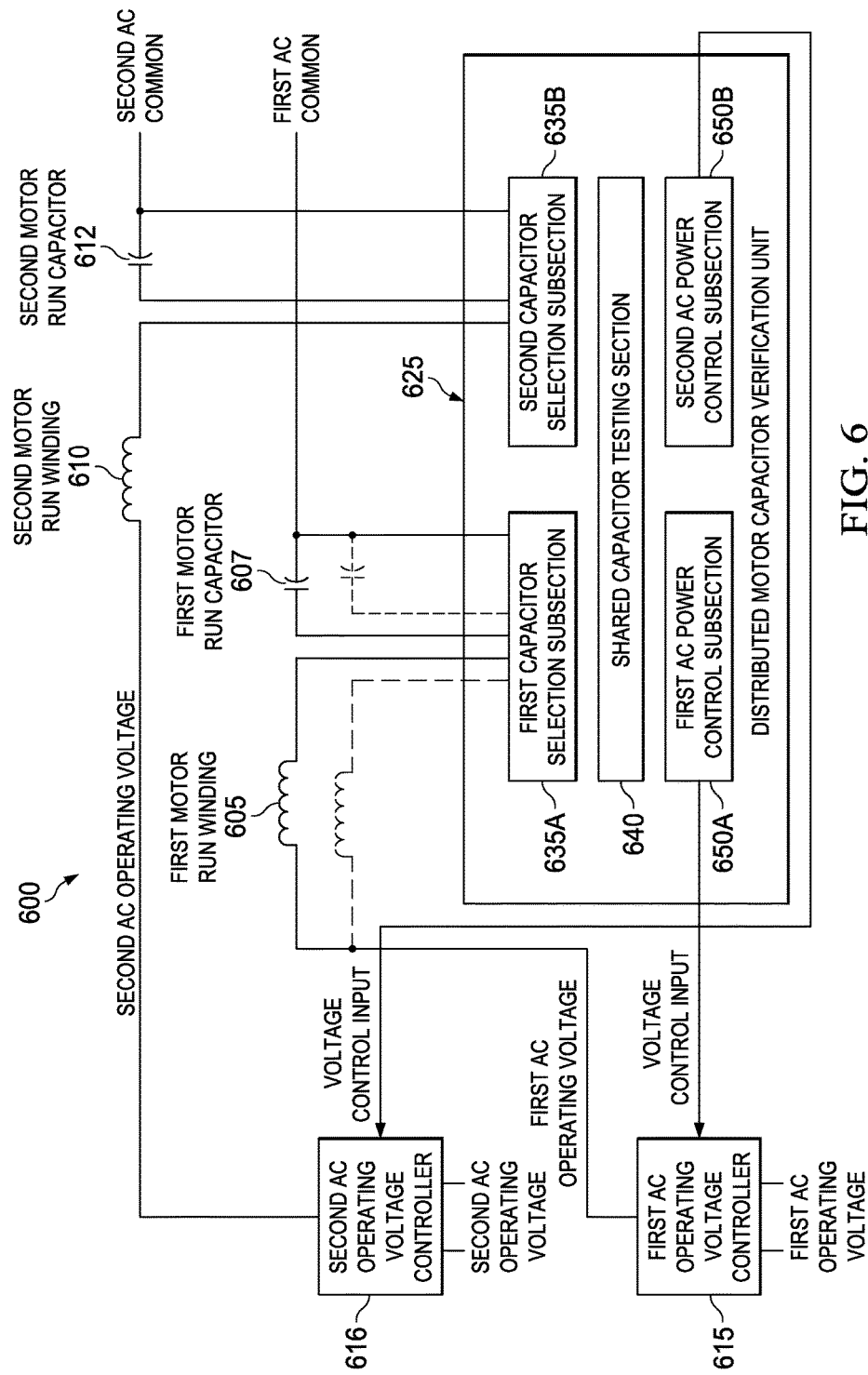
FIG. 6 illustrates a diagram of an embodiment of an electric motor operating system employing more than one motor and more than one AC operating voltage controller constructed according to the principles of the present disclosure.

FIG. 6 illustrates a diagram of an embodiment of an electric motor operating system employing more than one motor and more than one AC operating voltage controller, generally designated 600, constructed according to the principles of the present disclosure. Again, although not explicitly shown in the electric motor operating system 600, one or more optional motor start capacitors as well as optional replacement motor run and start capacitors may also be included that require verification testing.

The electric motor operating system 600 is representative of another electric motor operating system that may be employed with an application requiring first and second motors having separate AC operating voltage controllers. As before, if another electric motor is added to one of the AC operating voltage controllers (as indicated in FIG. 6), the electric motor operating system 600 so modified may be representative of an HVAC system where the two parallel electric motors are compressor and fan motors and the single motor is a blower motor.

The electric motor operating system 600 includes a first motor run winding 605 of a first electric motor and a first motor run capacitor 607, a second motor run winding 610 of a second electric motor and a second motor run capacitor 612 that are respectively connected to a first AC operating voltage controller 615 and a second AC operating voltage controller 616. The electric motor operating system 600 also includes a distributed motor capacitor verification unit 625.

The distributed motor capacitor verification unit 625 includes first and second capacitor selection subsections 635A, 635B, a shared capacitor testing section 640 and first and second AC power control subsections 650A, 650B that respectively control the first and second AC operating voltage controllers 615, 616. As before, if another electric motor is added to the first AC operating voltage controller 615, as indicated in FIG. 6, the first capacitor selection subsection 635A becomes a first shared capacitor selection subsection 635A.

In this embodiment, the first and second motor capacitor verification subsections 635A, 635B and the first and second AC power control subsections 650A, 650B are coupled to the shared capacitor testing section 640. Operation of the first and second capacitor selection subsections 635A, 635B parallel those of the first and second capacitor selection subsections 535A, 535B of FIG. 5. Similarly, operation of the first and second AC power control subsections 650A, 650B parallel those of the first and second AC power control subsections 545A, 545B of FIG. 5.

Operation of the shared capacitor testing section 640 typically employs a common motor activation control signal and accommodates verification testing connections of both the first and second capacitor selection subsections 635A, 635B and provides corresponding output results to both the first and second AC power control subsections 650A, 650B. Additionally, the shared capacitor testing section 640 may be located at a site remote from the first and second motor capacitor verification subsections 635A, 635B and the first and second AC power control subsections 650A, 650B.

Figure 7:
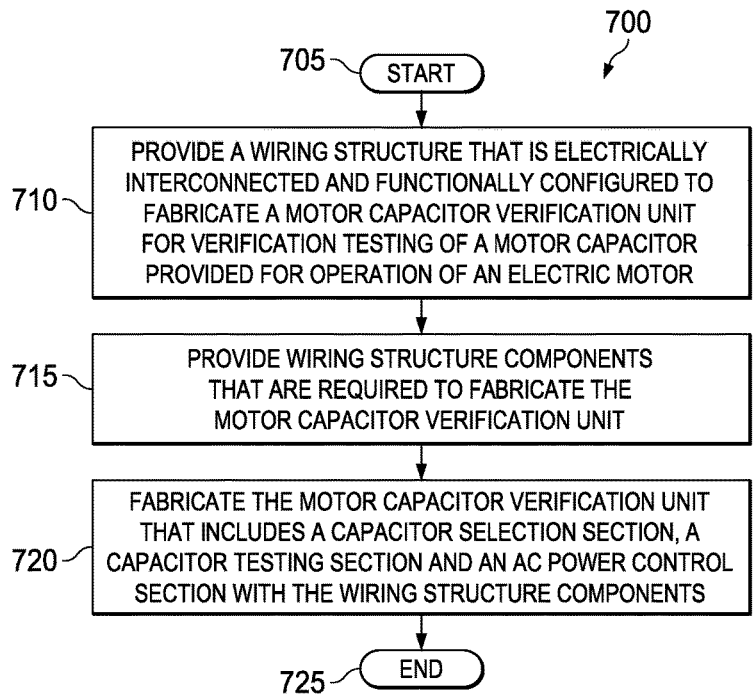
FIG. 7 illustrates a flow diagram of a method of manufacturing a motor capacitor verification unit for use with an electric motor carried out according to the principles of the present disclosure.

FIG. 7 illustrates a flow diagram of a method of manufacturing a motor capacitor verification unit for use with an electric motor, generally designated 700, carried out according to the principles of the present disclosure. The method 700 starts in a step 705 and, in a step 710, a wiring structure is provided that is electrically interconnected and functionally configured to fabricate a motor capacitor verification unit for verification testing of a motor capacitor provided for operation of an electric motor. Wiring structure components that are required to fabricate the motor capacitor verification unit are provided in a step 715. The motor capacitor verification unit is fabricated with the wiring structure components that include a capacitor selection section, a capacitor testing section and an ac power control section, in a step 720.

In one embodiment, the wiring structure is a printed wiring board. In another embodiment, the capacitor selection section is fabricated to connect the motor capacitor for verification testing. Correspondingly, the capacitor testing section is fabricated to evaluate the motor capacitor for operation with the electric motor. Additionally, the AC power control section is fabricated to only permit application of an AC operating voltage to the electric motor and the motor capacitor following a successful motor capacitor verification required for electric motor operation. The method 700 ends in a step 725.

Figure 8:
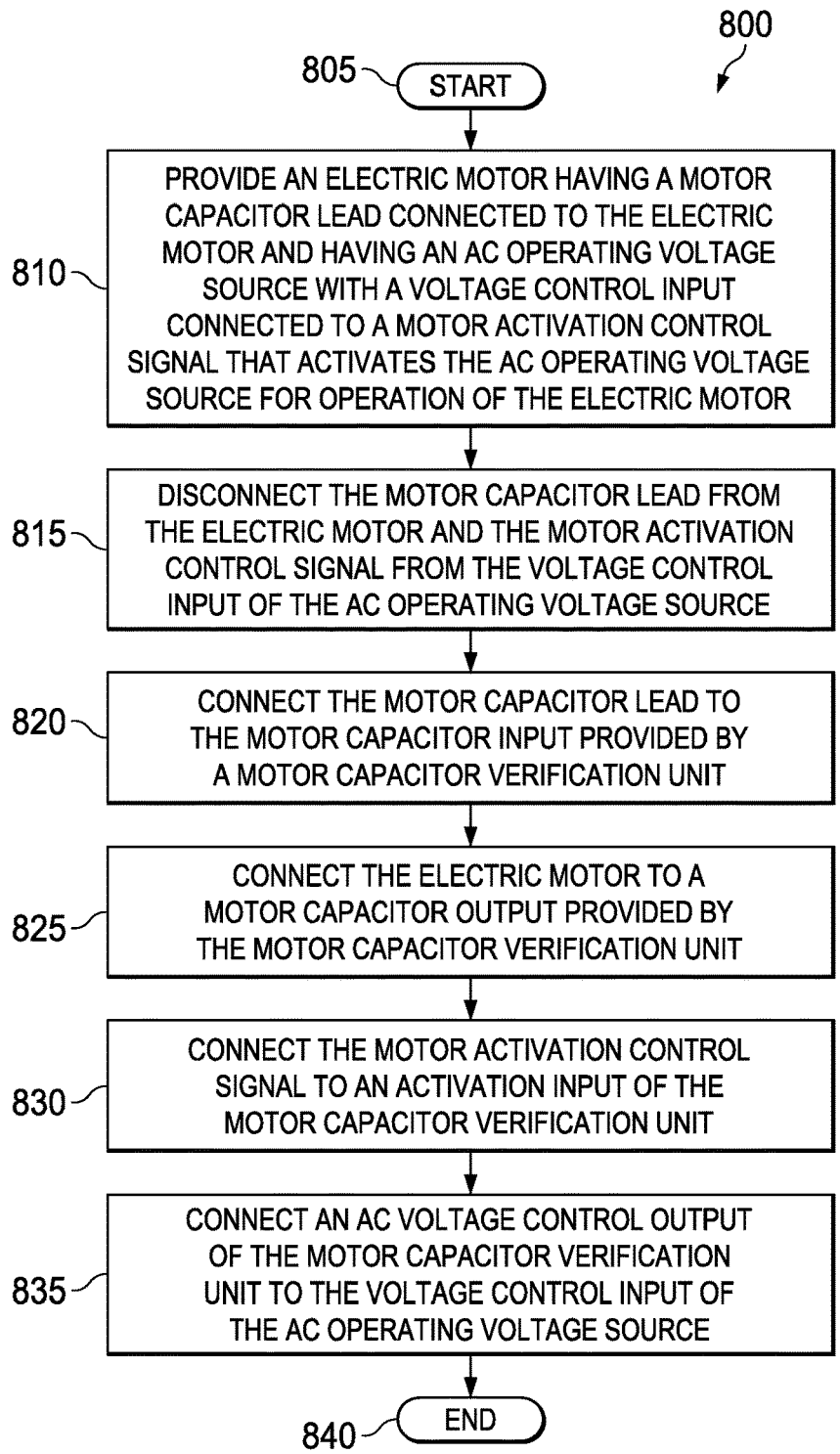
FIG. 8 illustrates a flow diagram of a method of retrofitting a motor capacitor verification unit to an electric motor carried out according to the principles of the present disclosure.

FIG. 8 illustrates a flow diagram of a method of retrofitting a motor capacitor verification unit to an electric motor, generally designated 800, carried out according to the principles of the present disclosure. The method 800 starts in a step 805. Then, an electric motor having a motor capacitor lead connected to the electric motor and having an ac operating voltage controller with a voltage control input connected to a motor activation control signal that activates the ac operating voltage controller for the electric motor are provided in a step 810. The motor capacitor lead is disconnected from the electric motor and the motor activation control signal is disconnected from the voltage control input of the ac operating voltage source, in a step 815.

The motor capacitor lead is connected to the motor capacitor input provided by a motor capacitor verification unit, in a step 820. The electric motor is connected to a motor capacitor output provided by the motor capacitor verification unit, in a step 825. The motor activation control signal is connected to an activation input of the motor capacitor verification unit, in a step 830. An AC voltage control output of the motor capacitor verification unit is connected to the voltage control input of the AC operating voltage controller, in a step 835.

In one embodiment, the motor capacitor input provides connecting and routing of the motor capacitor during verification testing of the motor capacitor. In another embodiment, the motor capacitor output provides connecting of the motor capacitor to the electric motor for normal motor operation. In yet another embodiment, the AC voltage control output of the motor capacitor verification unit controls activation of the AC operating voltage controller. In still another embodiment, the motor activation control signal controls activation of verification testing of the motor capacitor. The method 800 ends in a step 840.

Figure 9:
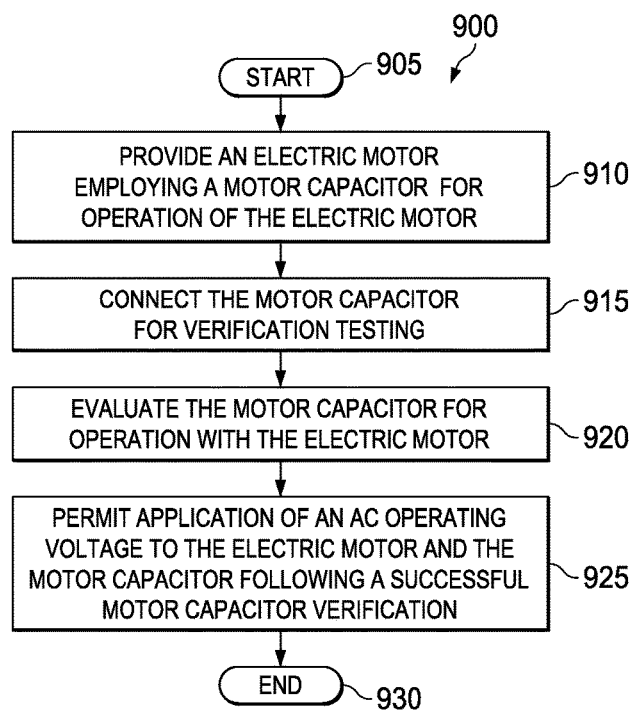
FIG. 9 illustrates a flow diagram of a method of operating an electric motor carried out according to the principles of the present disclosure.

FIG. 9 illustrates a flow diagram of a method of operating an electric motor, generally designated 900, carried out according to the principles of the present disclosure. The method 900 starts, in a step 905. Then, is in a step 910, an electric motor employing a motor capacitor is provided for operation of the electric motor. The motor capacitor is connected for verification testing, in a step 915. The motor capacitor is evaluated for operation with the electric motor, in a step 920. Application of an AC operating voltage to the electric motor and the motor capacitor is permitted following a successful motor capacitor verification, in a step 925.

In one embodiment, the electric motor is an induction motor and in another embodiment, the motor capacitor is selected from the group consisting of a motor run capacitor, a motor start capacitor, a replacement motor run capacitor and a replacement motor start capacitor.

In yet another embodiment, the verification testing of the motor capacitor includes analysis of a phase shift provided by the motor capacitor with respect to a reference test signal. Correspondingly, the phase shift provided by the motor capacitor is proportional to its capacitance value and, the phase shift is determined by a time difference in baseline signal crossings provided by the motor capacitor and the reference test signal. Additionally, the reference test signal employs a same frequency as the AC operating voltage applied to the electric motor, where the applied reference test signal is derived from a motor activation control signal, and the motor activation control signal may be initiated proximate the motor capacitor or at a central control site.

In still another embodiment, the verification testing of the motor capacitor includes preselecting a reference capacitance value for the motor capacitor to provide a comparison for a motor capacitor test result. Correspondingly, the reference capacitance value is provided from a set of predetermined capacitance values, and preselecting the reference capacitance value is software directed or hardware switch selected.

In yet another embodiment, the verification testing of the motor capacitor includes preselecting a capacitance tolerance percentage for a test results comparison of the motor capacitor where the capacitance tolerance percentage is a fixed percentage or a selectable percentage. The method 900 ends in a step 930.

While the methods disclosed herein have been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Those skilled in the art to which this application relates will appreciate that other and further additions, deletions, substitutions and modifications may be made to the described embodiments.

What is claimed is:

1. A motor capacitor verification system comprising:
    a capacitor selection electrical circuit coupled to an electric motor, said electric motor employing a motor capacitor for its operation, said capacitor selection electrical circuit configured to connect said motor capacitor for verification testing;
    a capacitor testing electrical circuit coupled to said capacitor selection electrical circuit and configured to evaluate said motor capacitor for operation with said electric motor; and
    an AC power control electrical circuit coupled to said capacitor testing electrical circuit, said AC power control electrical circuit configured to only permit application of an AC operating voltage to said electric motor and said motor capacitor after a successful motor capacitor verification as required for operation of said electric motor.

2. The motor capacitor verification system of claim 1 wherein said motor capacitor is selected from the group consisting of:
    a motor run capacitor;
    a motor start capacitor;
    a replacement motor run capacitor; and
    a replacement motor start capacitor.

3. The motor capacitor verification system of claim 1 wherein said capacitor selection section electrical circuit initially connects said motor capacitor to discharge an existing charge on said motor capacitor prior to said verification testing.

4. The motor capacitor verification system of claim 1 wherein said capacitor selection electrical circuit connects said motor capacitor for said verification testing following discharge of said motor capacitor.

5. The motor capacitor verification system of claim 1 wherein said capacitor section electrical circuit connects said motor capacitor for operation with said electric motor prior to application of said AC operating voltage.

6. The motor capacitor verification system of claim 1 wherein said capacitor testing electrical circuit employs said motor capacitor in a test electrical circuit using a reference test signal to provide a motor capacitor output signal having a phase shift that is proportional to a capacitance of said motor capacitor.

7. The motor capacitor verification system of claim 6 wherein said reference test signal is derived from a motor activation control signal requesting activation of said electric motor.

8. The motor capacitor verification system of claim 6 wherein said phase shift is determined from base line crossings of said reference test signal and said motor capacitor output signal.

9. The motor capacitor verification system of claim 1 wherein said AC power control electrical circuit provides an AC voltage control signal to activate connection of said AC operating voltage to said electric motor and said motor capacitor.

10. The motor capacitor verification system of claim 9 wherein said AC voltage control signal activates an AC operating voltage controller to provide said AC operating voltage to said electric motor and motor capacitor.

11. The motor capacitor verification system of claim 1 wherein said electric motor is an induction motor.

12. A motor capacitor verification method comprising:
    providing an electric motor employing a motor capacitor required for operation of said electric motor;
    connecting said motor capacitor for verification testing to an capacitor testing electric circuit configured to determine the state of said motor capacitor;
    evaluating said motor capacitor for operation with said electric motor using said capacitor testing electric circuit configured to determine the state of said motor capacitor; and
    with an electric circuit, applying an AC operating voltage to said electric motor and said motor capacitor only after a successful motor capacitor verification using said capacitor testing electric circuit configured to determine the state of said motor capacitor as required for operation of said electric motor.

13. The motor capacitor verification method of claim 12 wherein said motor capacitor is selected from the group consisting of:
    a motor run capacitor;
    a motor start capacitor;
    a replacement motor run capacitor; and
    a replacement motor start capacitor.

14. The motor capacitor verification method of claim 12 wherein said verification testing of said motor capacitor includes analysis of a phase shift provided by said motor capacitor with respect to a reference test signal.

15. The motor capacitor verification method of claim 14 wherein said phase shift provided by said motor capacitor is proportional to its capacitance value.

16. The motor capacitor verification method of claim 14 wherein said phase shift is determined by a time difference in baseline signal crossings provided by said motor capacitor and said reference test signal.

17. The motor capacitor verification method of claim 14 wherein said reference test signal employs a frequency identical to that of said AC operating voltage applied to said electric motor.

18. The motor capacitor verification method of claim 14 wherein said applied reference test signal is derived from a motor activation control signal.

19. The method as recited in claim motor capacitor verification method of claim 18 wherein said motor activation control signal is initiated proximate to said motor capacitor or at a central control site.

20. The motor capacitor verification method of claim 12 wherein said verification testing of said motor capacitor includes preselecting a reference capacitance value for said motor capacitor to provide a comparison for a motor capacitor test result.

21. The motor capacitor verification method of claim 20 wherein said reference capacitance value is provided from a set of predetermined capacitance values.

22. The motor capacitor verification method of claim 21 wherein preselecting said reference capacitance value is software directed selected or hardware switch selected.

23. The motor capacitor verification method of claim 12 wherein said verification testing of said motor capacitor includes preselecting a capacitance tolerance percentage for a test results comparison of said motor capacitor.

24. The motor capacitor verification method of claim 23 wherein said capacitance tolerance percentage is a fixed percentage or a selectable percentage.

25. The motor capacitor verification method of claim 12 wherein said electric motor is an induction motor.

26. A motor capacitor verification retrofit method comprising:
providing an electric motor having a motor capacitor lead connected to said electric motor and having an AC operating voltage controller with a voltage control input connected to a motor activation control signal that activates said AC operating voltage controller for operation of said electric motor;
disconnecting said motor capacitor lead from said electric motor and said motor activation control signal from said voltage control input of said AC operating voltage source;
connecting said motor capacitor lead to a motor capacitor input provided by a motor capacitor verification unit;
connecting said electric motor to a motor capacitor output provided by said motor capacitor verification unit;
connecting said motor activation control signal to an activation input of said motor capacitor verification unit; and
connecting an AC voltage control output of said motor capacitor verification unit to said voltage control input of said AC operating voltage controller.

27. The motor capacitor verification retrofit method of claim 26 wherein said motor capacitor input provides connecting and routing of said motor capacitor during verification testing of said motor capacitor.

28. The motor capacitor verification retrofit method of claim 26 wherein said motor capacitor output provides connecting of said motor capacitor to said electric motor for normal motor operation.

29. The motor capacitor verification retrofit method of claim 26 wherein said AC voltage control output of said motor capacitor verification unit controls activation of said AC operating voltage controller.

30. The motor capacitor verification retrofit method of claim 26 wherein said motor activation control signal controls activation of verification testing of said motor capacitor.

31. An electric motor system comprising:
one or more electric motors, each employing one or more motor capacitors required for electric motor operation; and
a motor capacitor verification unit, including: a capacitor selection electrical circuit, coupled to each of said one or more electric motors and said one or more motor capacitors, that connects each of said one or more motor capacitors for verification testing, a capacitor testing electrical circuit, coupled to said capacitor verification electrical circuit, that evaluates said one or more motor capacitors required for electric motor operation, and an AC power control electrical circuit, coupled to said capacitor testing electrical circuit, that only permits application of an AC operating voltage to said one or more electric motors and said one or more motor capacitors following a successful motor capacitor verification of said one or more motor capacitors required for electric motor operation.

32. The electric motor system of claim 31 wherein each of said one or more motor capacitors is selected from the group consisting of:
a motor run capacitor;
a motor start capacitor;
a replacement motor run capacitor; and
a replacement motor start capacitor.

33. The electric motor system of claim 31 wherein said capacitor selection electrical circuit initially connects said one or more motor capacitors to discharge an existing charge on each of said one or more motor capacitors prior to verification testing.

34. The electric motor system of claim 31 wherein said capacitor selection electrical circuit connects said one or more motor capacitors for verification testing following discharge of said motor capacitor.

35. The electric motor system of claim 31 wherein said capacitor testing electrical circuit employs each of said one or more motor capacitors in a test electrical circuit using a reference test signal to provide a motor capacitor output signal having a phase shift that is proportional to a capacitance value of said motor capacitor.

36. The electric motor system of claim 35 wherein said input reference signal is derived from a motor activation control signal requesting activation of said electric motor.

37. The electric motor system of claim 35 wherein said phase shift is determined from base line crossings of said reference test signal and said motor capacitor output signal.

38. The electric motor system of claim 31 wherein said AC power control electrical circuit provides an AC voltage control signal to activate connection of said AC operating voltage to said one or more electric motors and said one or more motor capacitors.

39. The electric motor system of claim 38 wherein said AC voltage control signal activates an AC operating voltage controller.

40. The electric motor system of claim 31 wherein said motor capacitor verification unit is implemented as a divided motor capacitor verification unit having a first motor capacitor verification subunit and a second motor capacitor verification subunit that operate separately of one another.

41. The electric motor system of claim 31 wherein said motor capacitor verification unit is implemented as a distributed motor capacitor verification unit having separate capacitor selection and AC power control electrical circuits that share a capacitor testing section electrical circuit.

42. The electric motor system of claim 31 wherein each of said one or more electric motors is an induction motor.

43. A heating ventilation air conditioning (HVAC) system comprising:
a compressor unit having compressor and fan motors that respectively employ a compressor motor capacitor and a fan motor capacitor for their operation;
a blower motor unit having a blower motor that employs a blower motor capacitor for its operation; and
a motor capacitor verification unit, including: a capacitor selection electrical circuit that connects said compressor, fan and blower motor capacitors for verification testing;
a capacitor testing electrical circuit, coupled to said capacitor selection electrical circuit, that evaluates said compressor, fan and blower motor capacitors for operation with their respective compressor, fan and blower motors, and an AC power control electrical circuit, coupled to said capacitor testing section electrical circuit, that only permits application of an AC operating voltage to said compressor, fan and blower motors and their respective compressor, fan and blower motor capacitors following successful compressor, fan and blower motor capacitor verifications required for compressor, fan and blower motor operations.

44. The heating ventilation air conditioning (HVAC) system of claim 43 wherein said compressor, fan, and blower motor capacitors are motor run capacitors.

45. The heating ventilation air conditioning (HVAC) system of claim 43 wherein at least one of said compressor and said blower motor units further includes a replacement motor capacitor that is connected for substitution with an existing motor capacitor having a failed motor capacitor verification.

46. The heating ventilation air conditioning (HVAC) system of claim 43 wherein said motor capacitor verification unit is implemented as a divided motor capacitor verification unit having a compressor unit motor capacitor verification subunit and a blower unit motor capacitor verification subunit that operate separately of one another.

47. The heating ventilation air conditioning (HVAC) system of claim 43 wherein said motor capacitor verification unit is implemented as a distributed motor capacitor verification unit having separate capacitor selection and AC power control electrical circuits for said compressor unit and said blower unit that share said capacitor testing electrical circuit.

48. The heating ventilation air conditioning (HVAC) system of claim 43 wherein a failed motor capacitor verification is indicated proximate said condenser and said blower units or remotely from said condenser and said blower units and in a visual or auditory manner.

49. The heating ventilation air conditioning (HVAC) system of claim 48 wherein said failed motor capacitor verification is indicated on a central HVAC control unit.

\* \* \* \* \*